United States Patent [19]

Suto et al.

[11] Patent Number: 4,744,662

[45] Date of Patent: May 17, 1988

[54] APPARATUS FOR MEASURING DIMENSIONS OF MICROPATTERN

[75] Inventors: Takeshi Suto, Funabashi; Masato Kumazawa, Kawasaki; Tatsumi Ishizeki, Ohmiya, all of Japan

[73] Assignee: Nippon Kogaku K. K., Tokyo, Japan

[21] Appl. No.: 881,391

[22] Filed: Jul. 2, 1986

[30] Foreign Application Priority Data

Jul. 9, 1985 [JP] Japan .................. 60-150927

[51] Int. Cl.$^4$ .................................. G01B 11/02
[52] U.S. Cl. .................. 356/372; 250/560; 356/384; 356/387
[58] Field of Search ............ 356/372, 384, 385, 386, 356/387; 250/560

[56] References Cited

U.S. PATENT DOCUMENTS

| | | | |
|---|---|---|---|
| 4,112,309 | 9/1978 | Nakazawa et al. | 250/560 |
| 4,568,188 | 2/1986 | Weber et al. | 356/384 |

FOREIGN PATENT DOCUMENTS 53-23172  7/1978  Japan .

OTHER PUBLICATIONS

"Automatic Mask Pattern Inspection for Printed Circuits . . . ", Nakashima et al., SPIE, vol. 182, p. 38, (1979), Imaging Applications for Automated Industrial Inspection & Assembly.

*Primary Examiner*—F. L. Evans
*Attorney, Agent, or Firm*—Shapiro and Shapiro

[57] ABSTRACT

An apparatus for measuring dimensions of a micropattern has a photoelectric sensor for scanning an enlarged image of a pattern and detects the positions of the leading and trailing edges by use of a predetermined slice level from a photoelectric signal which is derived by this sensor, thereby detecting the interval between those edges. The slice level is corrected in accordance with the interval between the edges to be measured. An amount of correction is stored as a predetermined table. A determination is made by an interval discriminating section to see if the correction needs to be performed or not.

7 Claims, 5 Drawing Sheets

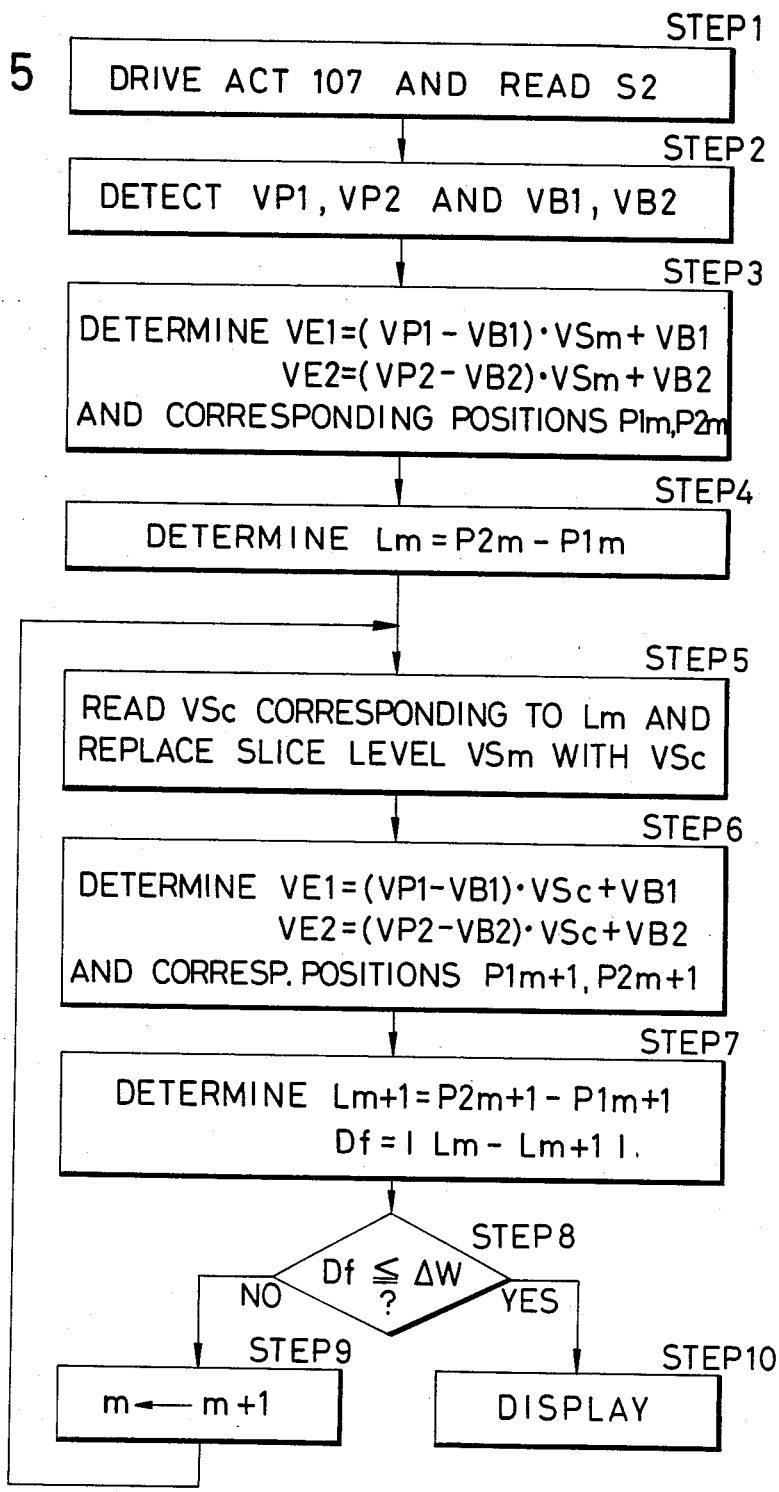

APPARATUS FOR MEASURING DIMENSIONS OF MICROPATTERN

BACKGROUND OF THE INVENTION

1. Field of the Invention

The present invention relates to an apparatus for measuring an interval between two edges of a pattern and, more particularly, to an apparatus for measuring a line width from an edge to another edge and the like of a pattern formed on a photomask, reticle, or semiconductor wafer for use in manufacturing of a semiconductor element.

2. Related Background Art

In recent years, a line width of a pattern drawn on a photomask, reticle, or the like to manufacture a semiconductor element such as IC, VLSI, and the like has rapidly become fine due to the demands to realize high integration and fine patterns. In association with this tendency, a high degree of accuracy is also required for the apparatus for measuring the line widths of those patterns. There has been known apparatus in which a pattern drawn on an object to be measured such as a mask, reticle, or the like is formed as an image by the optical system, the light intensity distribution of the pattern image is photoelectrically scanned, a time-sequential photoelectric signal is compared with a predetermined threshold value (slice level), and thereby measuring the line width of the pattern. In such a line width measuring apparatus, in order to obtain highly accurate measured values, it is necessary to optimize various kinds of optical conditions such as numerical apertures of the optical system (objective lens and the like), illuminating condition, wavelength of illumination light, focus condition, and the like and at the same time, an accurate slice level needs to be set. In general, when the above optical conditions are set, the slice level commensurate with these conditions can be promptly obtained by theoretical calculation. However, it has been found that even if the optical conditions and slice level were optimized as well, errors occur in the measured values due to the optical flare amount and the state of the pattern arrangement (isolated pattern, line and space, rectangle, etc.) and the magnitude of the line width. Particularly, when the line width decreases and becomes a value in the submicron range, the error of the measured value increases in dependence on the state of the pattern arrangement and value of the line width. Consequently, the accurate line width value cannot be obtained.

SUMMARY OF THE INVENTION

It is an object of the present invention to provide a measuring apparatus for measure a line width, i.e., an interval between edges in the submicron range with a high degree of accuracy.

A measuring apparatus of the present invention has a photoelectric sensor for scanning an enlarged image of a pattern and detects the positions of the leading and trailing edges by use of a predetermined slice level from a photoelectric signal which is derived by this sensor, thereby detecting the interval between those edges. The slice level is corrected in accordance with the interval between the edges to be measured. An amount of correction is stored as a predetermined table. A determination will be made by an interval discriminating section to see if the correction needs to be performed or not.

BRIEF DESCRIPTION OF THE DRAWINGS

FIG. 5 is a flowchart showing a procedure for line width measuring processes.

DESCRIPTION OF THE PREFERRED EMBODIMENTS

Figure 1:
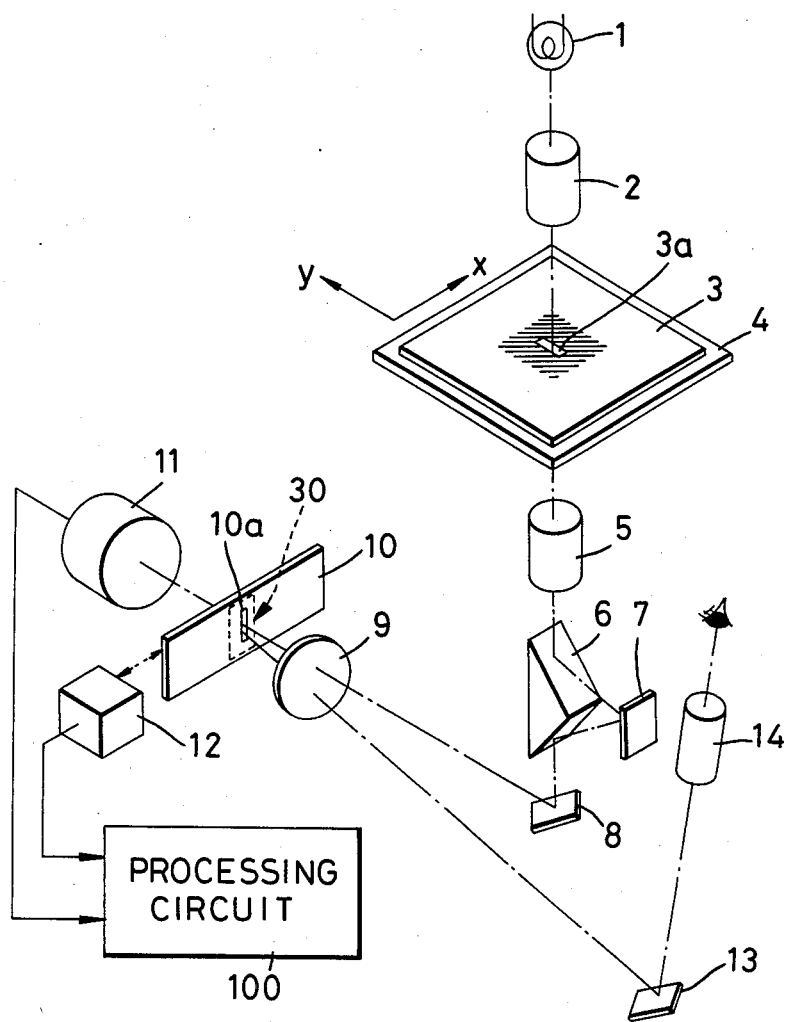
FIG. 1 is a perspective view showing a schematic arrangement of an optical system of an apparatus according to an embodiment of the present invention.

A schematic arrangement of an embodiment is shown in FIG. 1.

Since an optical system in FIG. 1 has been disclosed in detail in the Official Gazette of Japanese patent examined publication No. 23172/1978, the optical system will be briefly described here. The light from a light source 1 illuminates a mask 3 through an illuminating system lens 2. The mask 3 is put on a stage 4 which is movable in the x and y directions. It is now assumed that a pattern 3a on the mask 3 is a rectangular light transmitting section. An image 30 of the pattern 3a is formed on a slit plate 10 through an objective lens 5, a mirror block 6, plane mirrors 7 and 8, and a field lens 9. The mirror block 6 and plane mirror 7 function as an image rotator which is rotatable around an optical axis of the objective lens 5 and can rotate the direction of the pattern image 30 to be formed on the slit plate 10 in an arbitrary direction.

A microslit 10a extending in one direction is formed in the slit plate 10. The light transmitted through the slit 10a reaches the photosensitive surface of a photomultiplier 11. The slit plate 10 has a mechanism which can move in the direction perpendicular to the extending direction of the slit 10a and the pattern image 30 is scanned by the slit. An amount of movement of the slit plate 10 is detected by the encoder 12. The slit plate 10 has a mirror surface, and reflected light forming the pattern image 30 is transmitted through the field lens 9 to the plane mirror 13 and eyepiece 14. Therefore, the operator can observe the scanning states of both of the pattern image 30 and slit 10a through the eyepiece 14. Due to the movement of the slit plate 10, the photomultiplier 11 generates a photoelectric signal corresponding to the light intensity distribution in accordance with the scanning position of the slit on the pattern image 30.

Figure 2:
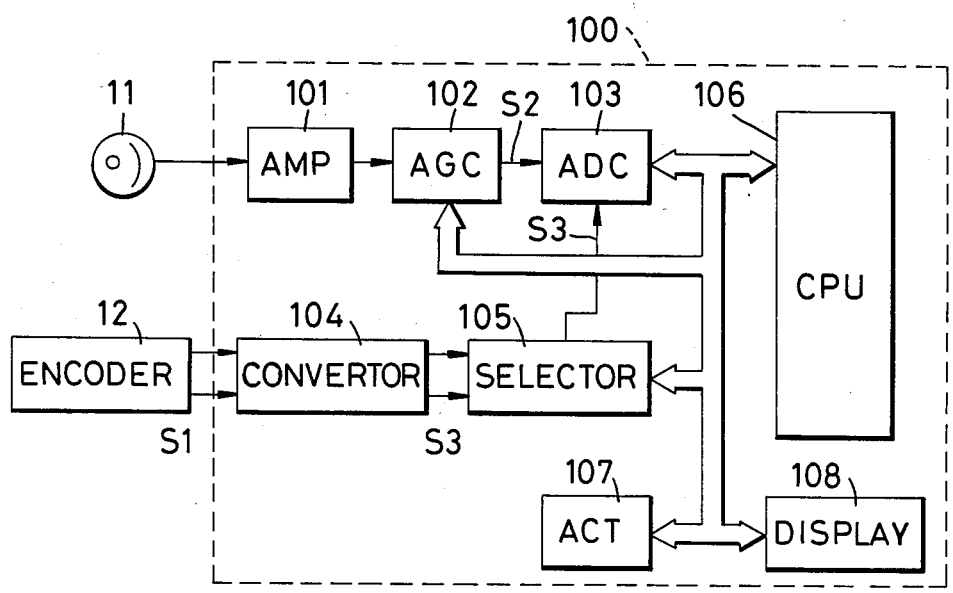
FIG. 2 is a circuit block diagram showing a control system of the apparatus according to the embodiment of the invention.

Both output signals of the photomultiplier 11 and encoder 12 are input to a processing circuit 100. The details of the processing circuit 100 are shown in FIG. 2. After the photoelectric signal from the photomultiplier 11 is converted from a current to a voltage by an amplifier 101, the voltage signal is input to an auto-gain controller (hereinafter, abbreviated as an AGC) 102 for controlling the level of the photoelectric signal so that it is fitted to the subsequent electrical processes. Two-phase signals $S_1$ like sine waves having a phase difference of 90° are output from the encoder 12. A converter 104 receives the two-phase signals $S_1$ and converts to encoder pulses $S_3$ for every unit amount of movement corresponding to the scanning direction of the slit plate 10.

A direction selector 105 selects either one of the encoder pulse train $S_3$ corresponding to the scanning direction of the slit plate 10. The selected encoder pulse train $S_3$ is input to an analog-to-digital converter (hereinafter, abbreviated to an ADC) 103 and used as a timing (sampling) pulse for the digital conversion.

Each time the encoder pulses $S_3$ are generated, the ADC 103 converts a photoelectric signal $S_2$ from the AGC 102 to a digital value corresponding to the magnitude of the signal $S_2$. This digital value is supplied to a central processing unit (hereinafter, abbreviated as a CPU) 106 of a computer through a data bus. The CPU 106 sequentially stores the digital value of the photoelectric signal in a memory, an address of which is updated each time the encoder pulses $S_3$ are generated. The CPU 106 executes discrimination to see if the level of the photoelectric signal should be corrected or not and the control of this level by the AGC 102 through the data bus. The CPU 106 also controls the selection by the direction selector 105. Further, the CPU 106 outputs a command to an actuator 107 to control the scanning direction and driving of the slit plate 10.

The CPU 106 performs functions such as detection of the interval between edges, discrimination of the necessity of the correction, correction of the slice level, and the like, using software. The CPU 106 determines the interval between edges, i.e., line width of the pattern $3a$ on the basis of the waveform data of the photoelectric signal supplied from the ADC 103.

A display 108 receives the calculated line width value and displays this value.

Figure 3A:
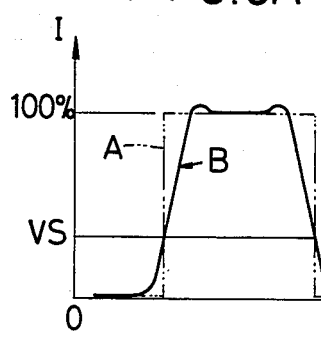
FIGS. 3A and 3B are waveform diagrams showing examples of light intensity distribution.

The line width and the like of a pattern are measured by the foregoing measuring apparatus. The principle of measurement of the line width will be briefly described. The transmission factor of a photomask on which a pattern was formed by evaporation depositing of chrome or the like on a glass substrate changes like a rectangle in the ideal case. Therefore, in the case of the pattern $3a$, the light intensity distribution of the pattern image 30 in the scanning direction of the slit $10a$ also changes like a rectangle in the ideal case as shown by a characteristic A indicated by an imaginary line in FIG. 3A. However, the actual light intensity distribution varies like a characteristic B indicated by a solid line in FIG. 3A due to various conditions of the optical system. In the graph, an ordinate axis denotes a light intensity I and an axis abscissa denotes a position x. The distribution of the characteristic B can be promptly obtained by calculations based on optical theory using a numerical aperture (N.A.) of the optical system, a coherence factor $\sigma$ between the illuminating system and the objective lens system (ratio between the N.A. of the illuminating system and the N.A. of the objective lens), and a waveform or the like as a parameter.

As will be also obvious from those distribution waveforms, the leading and trailing edge portions of the pattern $3a$ have constant inclinations. Therefore, in comparison of the photoelectric signal (which is obtained when the intensity distribution is scanned by the slit $10a$) with the slice level, a method of determining the slice level is an important factor which will decide the accuracy of the measured line width value. In the case of the distribution waveform as shown by the characteristic B in FIG. 3A, according to the calculations based on the optical theory, assuming that the maximum value of the distribution waveform is 100%, the value of slice level VS is 33% when the coherence factor $\sigma=1$; 27.5% when $\sigma=0.8$; and 25.4% when $\sigma=0.4$. Therefore, the line width can be accurately measured by determining the slice level corresponding to the coherence factor $\sigma$ of the apparatus and by measuring the length in the scanning direction of the intensity distribution of the pattern image 30.

Figure 3B:
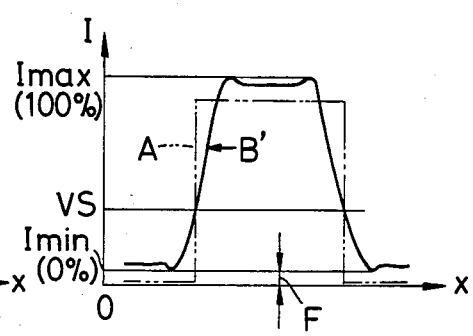

Further, in the actual optical system, flare, which is difficult to be obtained by the calculation, is generated, and this flare is added as an offset to the waveform of the characteristic B. Due to the offset by the flare amount F, the actual intensity distribution of the pattern image 30 becomes a waveform B' as shown by a solid line in FIG. 3B. Therefore, the line width can be always accurately measured irrespective of the flare amount F by assuming that the difference $(I_{max}-I_{min})$ between the maximum value $(I_{max})$ and the minimum value $(I_{min})$ of the photoelectric signal is 100% and considering that the minimum value is zero and deciding the slice level VS as mentioned above.

However, as the results of further detailed study and experiments, it has been clearly understood that even if the slice level was optimized in accordance with the coherence factor $\sigma$ as mentioned above as well, the optimum value is not always obtained in dependence on the line width of a pattern to be measured. This is because if two parallel edges adapted to specify the line width of the pattern approach, the influences which will be exerted on the waveforms of the edge portions by diffraction differ. Therefore, the same shall also apply to the case of a pattern having a fine line and space.

Figure 4A:
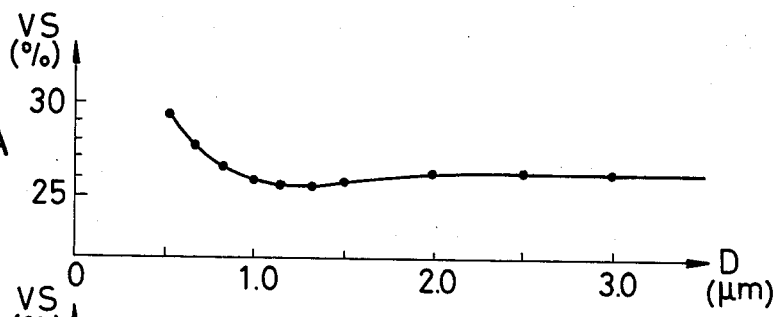
FIGS. 4A to 4D are graphs showing various kinds of curves of the correction characteristics of the slice level to the line width value, respectively.
Figure 4B:
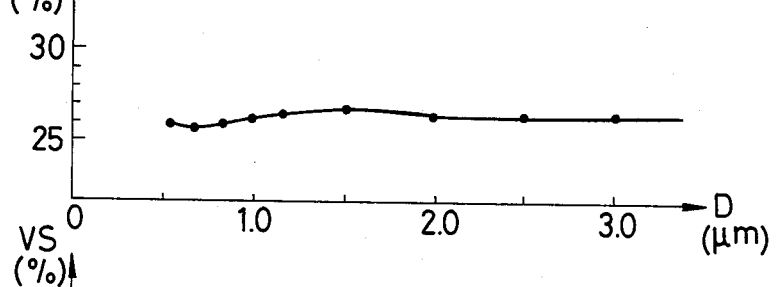
Figure 4C:
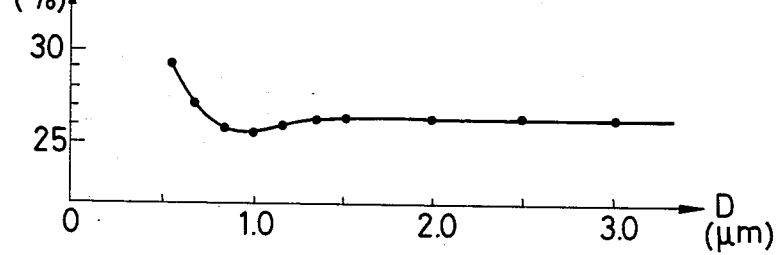

As explanation will now be made with respect to an example of the correlation between the line width value of the actual pattern and the optimum slice level to obtain this line width value as a measured value. In FIGS. 4A to 4D, an ordinate axis denotes a percentage (%) of the slice level VS and an abscissa axis represents an actual line width value D ($\mu$m). FIG. 4A shows a case of a bright line pattern in a dark background. FIG. 4B shows the case of a dark line pattern in a bright background. FIG. 4C shows the case of a pattern consisting of repetitive bright and dark portions (line and space). In each of these cases, the experiments were carried out under optical conditions such that the wavelength used is 546 nm (e line), the N.A. of the objective lens is 0.75, and the coherence factor $\sigma$ is 0.6. It will be understood from FIG. 4A that the slice level VS rapidly changes due to the measurement of the line width below 1 $\mu$m. In other words, in the case of measuring a line width below 1 $\mu$m, if the slice level VS is fixed to the level to be used in the measurement of the line widths of 2 $\mu$m and 3 $\mu$m, errors of the measured values (dimensions) will increase. In the case of FIG. 4B as well, as the line width decreases, the slice level VS changes. In the case of FIG. 4C, the slice level VS varies in the manner similar to FIG. 4A. It will be understood from FIGS. 4A to 4C that when the line width value is smaller than about 1.5 $\mu$m (i.e., nearly twice as large as an Airy disk), the slice level VS needs to be corrected. It is obvious that the correction amount is not unconditionally determined due to the conditions of the shape and arrangement of the pattern to be measured.

Figure 4D:
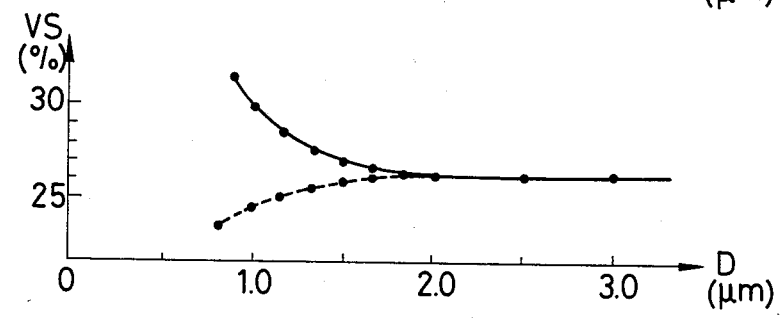

There is also a similar tendency with respect to an isolated microsquare pattern. For example, there is such a relation as shown in FIG. 4D between the dimension D of the square pattern and the slice level VS. In FIG.

4D, a broken line indicates the case of the square pattern formed as a dark portion in a bright background and a solid line represents the case of the square pattern formed as a bright portion is the dark background. These experiments were executed under the same optical conditions as those in FIGS. 4A to 4C.

The CPU 106 preliminarily stores the slice level correction data as shown in FIGS. 4A to 4D. Any one of the slice level correction data is selected in accordance with the combination of the patterns to be measured. This selection is ordinarily performed by the operator. However, in the case of observing the patterns by a television camera, by recognizing the shape of the pattern from the image pickup information of the pattern due to an image analysis method and automatically selecting the correction data, the operating performance will be further improved.

The line width measuring operation of the embodiment will now be described with reference to FIG. 5.

In step 1, the CPU 106 outputs a command to the actuator 107 to scan the pattern image 30 by the slit 10a and reads the digital data of the optimized light intensity distribution of the pattern image 30 by the photomultiplier 11, amplifier 101, AGC 102, and ADC 103. It is assumed that the pattern image 30 is a bright line pattern in the embodiment. Therefore, upon completion of the scan by the slit, a photoelectric signal waveform as shown in FIG. 6 is stored in the memory in the CPU together with the scanning position.

Figure 6:
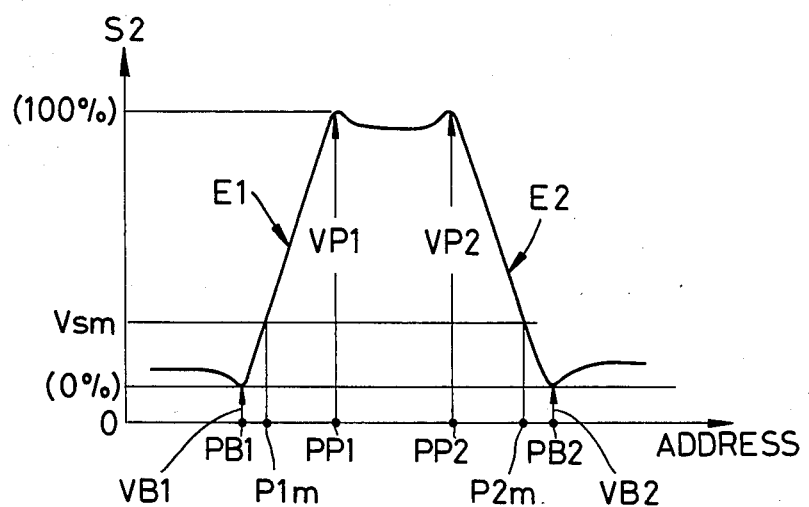
FIG. 6 is a waveform diagram of the light intensity distribution.

In FIG. 6, an ordinate axis denotes the magnitude of the photoelectric signals $S_2$ and an abscissa axis represents the scanning position, i.e., the address in the memory. The sampling is performed by the ADC 103 each time the encoder pulse is generated. The access address in the memory is also increased by only "+1" or "−1" by this pulse, so that there is an unconditional relation between the scanning position of the slit and the address.

In the next step 2, the CPU detects the maximum value $VP_1$, the scanning position $PP_1$ corresponding thereto, the minimum value $VB_1$, and the scanning position $PB_1$ corresponding thereto near the leading edge ($E_1$ in FIG. 6) in the waveform data read and stores those values. Similarly, the maximum value $VP_2$, the scanning position $PP_2$ corresponding thereto, the minimum value $VB_2$, and the scanning position $PB_2$ corresponding thereto near the trailing edge ($E_2$ in FIG. 6) in the waveform data are detected and those values are stored. The CPU then determines the position $P1_m$ of the edge $E_1$ by use of the standard slice level in step 3. This standard slice level is a constant value derived on the basis of the optical theory when the line width is large and denotes the slice level in the case where the line width is above 1.5 to 2.0 μm in FIGS. 4A to 4D. Now, assuming that the slice level is $VS_m$, the magnitude $VE_1$, of the photoelectric signal which coincides with the slice level $VS_m$ at the edge $E_1$ will be expressed by the following expression (1).

$$VE_1 = (VP_1 - VB_1) \cdot VS_m + VB_1 \quad (1)$$

Since the value of $VS_m$ is expressed by percentage, in the case of 36%, for example, $VS_m = 0.36$. The CPU calculates expression (1) to obtain $VE_1$ and detects the scanning position $P1_m$ corresponding to the value of $VE_1$ from the waveform data and stores it. In expression (1), a suffix m denotes the number of processing times of the calculation of the line width. When $VS_m$ is the standard slice level, the initial value of m is set to 1 (m=1).

The position $P2_m$ of the edge 2 is determined in a manner similar to the above. The magnitude $VE_2$ of the photoelectric signal which coincides with the slice level $VS_m$ at the edge 2 is expressed by the following expression (2).

$$VE_2 = (VP_2 - VB_2) \cdot VS_m + VB_2 \quad (2)$$

The CPU calculates expression (2) to obtain $VE_2$ and detects the scanning position $P2_m$ corresponding to the value of $VE_2$ from the waveform data and stores it.

In the next step 4, by calculating the difference between two edge positions $P1_m$ and $P2_m$ detected due to the standard slice level, the line width value $L_m$ is obtained and stored as a reference value. In step 5, the CPU reads the slice level $VS_c$ corresponding to the line width value $L_m$ from the correction table in which the correction characteristics of the line width value to the slice level as shown in FIGS. 4A to 4D have been stored. In this case, since the pattern image 30 is a bright line, the characteristic curve shown in FIG. 4A is used. The slice level $VS_m$ is replaced, i.e., corrected to $VS_c$.

In the next step 6, the CPU determines the positions $P1_{m+1}$ and $P2_{m+1}$ of the edges $E_1$ and $E_2$ by use of the corrected slice level $VS_c$ on the basis of expressions (1) and (2) in a manner similar to step 3.

In step 7, the corrected line width value $L_{m+1}$ is determined from the difference between two edge positions $P1_{m+1}$ and $P2_{m+1}$ and stored. The absolute value of the difference between the preceding line width value $L_m$ stored as a reference value and the current line width value $L_{m+1}$ is calculated as a deviation $D_f$.

In step 8, the CPU compares a preset allowable value $\Delta W$ of deviation with the deviation $D_f$. When $D_f \leq \Delta W$, step 10 follows. If NO in step 8, step 9 follows. The allowable value $\Delta W$ can be arbitrarily set in accordance with the line width value to be measured and the like. If the allowable value $\Delta W$ is small, the measuring accuracy is improved. However, $\Delta W$ cannot be limitlessly set to a small value but is limited to be a value within a certain accuracy under conditions of the arrangement of the apparatus and the like.

If NO in step 8, the CPU updates the content of the line width value $L_m$ stored as a reference value to $L_{m+1}$ and thereafter the value of m is increased by only "+1". The operations in steps 5 to 9 will be repeated.

If YES in step 8, the CPU displays the line width value $L_m$ stored as a reference value or $L_{m+1}$ on the display 108. The measurement of the line width of the pattern 3a is finished in this manner.

In the measurement of the line width of the embodiment as mentioned above, the function to directly discriminate whether or not the line width value needs the correction of the slice level is not provided. However, the execution of the following processes results in substantially the same as the discrimination of whether the line width value needs the correction or not: namely, the line width value $L_m$ is obtained using the standard slice level $VS_m$ in the first calculating process; the line width value $L_{m+1}$ is derived using the slice level $VS_c$ corrected in correspondence to $L_m$ in the next calculating process; and a check is made to see if $D_f \leq \Delta W$ or not. For example, if the line width of the pattern 3a has such a large value as to need no correction, the standard slice level $VS_m$ has the same value as the corrected slice level $VS_c$ as will be also apparent from the characteristics in FIGS. 4A to 4D and the line width value $L_m$ is equal to $L_{m+1}$. Therefore, the CPU will decide that $D_f \leq \Delta W$ in step 8 by the single discriminating step. It is also obviously possible to directly provide a discriminating function after step 4 and thereby to discriminate the necessity of the correction. However, since the boundary of the line width value to be corrected differs in dependence on the shape of the pattern, the correction point must be changed in accordance with the pattern shape. When the measuring accuracy is considered, even if the correction point was decided as well, the operations in steps 5 to 9 will be eventually repeated in the case where the line width value is smaller than the correction point. Consequently, the addition of the function (step) to directly discriminate the line width value may contrarily cause the processes to be complicated.

In the embodiment, an example of measurement of a bright line pattern has been described. However, in the case of a dark line pattern, line and space, square pattern, or the like as well, the line width can be also measured in the manner substantially similar to the above by merely changing the correction characteristic table.

Further, the waveform data of the light intensity distribution of the pattern image 30 to be stored in the memory is the discrete data which is determined by the resolution of the encoder pulse. Therefore, to measure the line width above the resolution of the encoder pulse, it is sufficient to perform general dividing (interposing) processes such as an interpolating method between pulses or the like.

The present invention is not limited to the case where the time-sequential photoelectric signal is obtained due to the slit scan as in the foregoing embodiment. A similar effect will be also obtained in a case where the pattern to be measured is scanned by a spot light beam and the reflected light (also including scattered light, diffracted light, and the like) is photoelectrically detected through the objective lens. In this case, since the correction characteristics are not always the same as those in FIGS. 4A to 4D, the optimum correction characteristics need to be preliminarily obtained by calculations based on the optical theory and stored in the memory.

Further, in a case where the photoelectric signal is compared with the slice level voltage by an analog comparator and binarized and the line width is measured from the width of the binarized signal (the number of encoder pulses) as well, a similar effect will be derived by converting the corrected slice level value which is obtained from the correction table into a voltage value by a digital-to-analog converter. In such a case, it is necessary to store the waveform of the photoelectric signal or to perform the slit scan (photoelectric scan) each time the slice level is changed.

What we claim is:

1. An apparatus for measuring size of a microelement constituting a pattern comprising:
    means for irradiating energy to said pattern to form an energy intensity distribution corresponding to said pattern;
    means for generating a photoelectric signal corresponding to said energy intensity distribution in such a direction as to cross at least two edges of said microelement;
    means for comparing the level of said photoelectric signal with a predetermined slice level to determine a distance between said two edges; and
    means for changing said predetermined slice level when said distance is smaller than a predetermined value.

2. A measuring apparatus according to claim 1, wherein said changing means includes means for deciding the necessity of correction of said predetermined slice level on the basis of said determined distance between said two edges.

3. A measuring apparatus according to claim 1, wherein said changing means includes:
    means for setting another slice level which is determined on the basis of the distance between said two edges; and
    means for comparing the level of said photoelectric signal with said another slice level and thereby determining a corrected distance between said two edges.

4. A measuring apparatus according to claim 3, wherein said changing means further includes means for discriminating whether the difference between the distance determined due to the comparison with said predetermined slice level and said corrected distance lies within a predetermined allowable range or not.

5. A measuring apparatus according to claim 1, wherein said comparing means compares the level of said photoelectric signal with the slice level changed by said changing means to re-determine the distance between said two edges.

6. A measuring apparatus according to claim 1, wherein said irradiating means includes means for supplying a light beam to irradiate said pattern and an image forming optical system to form an image of said pattern.

7. A measuring apparatus according to claim 6, wherein said photoelectric signal generating means includes means for photoelectrically scanning the image of said pattern and thereby generating a time-sequential photoelectric output.

* * * * *